United States Patent [19]

Bickley et al.

[11] Patent Number: 4,852,123
[45] Date of Patent: Jul. 25, 1989

[54] NEARLY DC IF PHASE LOCKED TRANSCEIVER

[75] Inventors: Robert H. Bickley, Scottsdale; Christopher D. Broughton, Mesa; Michael N. Pickett, Phoenix, all of Ariz.

[73] Assignee: Motorola, Inc., Schaumburg, Ill.

[21] Appl. No.: 284,778

[22] Filed: Dec. 12, 1988

Related U.S. Application Data

[63] Continuation-in-part of Ser. No. 153,113, Feb. 5, 1988, abandoned.

[51] Int. Cl.[4] .............................................. H04B 1/10
[52] U.S. Cl. .................................... 375/9; 324/77 C; 375/97; 455/76; 455/86; 455/259; 455/324
[58] Field of Search ........................ 375/1, 7, 8, 9, 78, 375/88, 97; 455/67, 75, 76, 84, 85, 86, 258, 259, 260, 324; 324/77 C; 331/4

[56] References Cited

U.S. PATENT DOCUMENTS

| | | | |
|---|---|---|---|
| 3,825,830 | 7/1974 | O'Connor | 455/86 |
| 4,153,884 | 5/1979 | Ikeguchi et al. | 455/76 |
| 4,349,919 | 9/1982 | Richardson | 455/86 |
| 4,451,782 | 5/1984 | Ashida | 324/77 C |
| 4,599,743 | 7/1986 | Reed | 455/324 |
| 4,670,870 | 6/1987 | Hewinson et al. | 370/32 |

*Primary Examiner*—Benedict V. Safourek
*Attorney, Agent, or Firm*—Jordan C. Powell

[57] ABSTRACT

A receiver which converts the RF carrier to a very low frequency and incorporates a PLL demodulator which allows the IF to be AC coupled. This PLL demodulator does not include the IF filters. The bandwidth of the PLL demodulator is wide enough to demodulate FM. Also, components of the receiver can be switched to a transmission mode capable of FM or PSK modulation with a simple circuit. Finally, the receiver includes an AM or PSK coherent amplitude detector which is modified into an imageless spectrum analyzer.

26 Claims, 9 Drawing Sheets

NEARLY DC IF PHASE LOCKED TRANSCEIVER

This application is a continuation-in-part of prior application Ser. No. 153,113, filed Feb. 5, 1988, and now abandoned.

BACKGROUND OF THE INVENTION

Many conventional receivers employ a super heterodyne approach wherein the received frequency is converted to a relatively high intermediate frequency (IF) before demodulation. One of the major problems with wide frequency range coverage with this type of receiver is the large number of spurious responses which require extremely complex and complicated electronically tuneable filters. Further, because the intermediate frequency is relatively high, the layout of the intermediate frequency circuit is critical and requires shielding. Also, the local oscillator/synthesizer wideband shielding and decoupling becomes extremely complicated because RF submultiples can lie in the IF band.

Recently, receivers which convert the RF carrier to DC and the information modulated on the RF carrier to audio frequencies have been developed. These receivers have many advantages over the super heterodyne receivers, some of which are: no image signals or noise; spurious responses which are far from the center frequency, therefore, simplifying the preselector; the audio frequency IF allows a low power drain design with high dynamic range; and the IF filter is an inexpensive, noncritical low pass design.

The DC IF receivers also have several disadvantages. First, the signal will generally be several orders of magnitude lower than the amplifier and mixer DC offsets. Second, the receiver usually needs to be phased locked to the received carrier to properly demodulate the signal. The receiver IF filter is one of the components of the phase locked loop and limits the loop bandwidth. A narrow loop bandwidth eliminates using the phase locked loop as an FM demodulator. Even with a narrow phase locked loop, the unwanted DC offsets need to be well below the DC component due to the carrier. Special circuitry must be used to null this unwanted DC.

In most prior art transceivers, frequency modulation in the transmitter is done by modulating the local oscillator directly. Assuming that the local oscillator is a frequency synthesizer, several problems exist with FM modulation. First, the synthesizer contains a voltage controlled oscillator (VCO) the sensitivity of which usually changes with local oscillator frequency, resulting in a changing modulator gain. Second, the VCO is part of a phase locked loop which will track out the modulation if the loop bandwidth is too wide. This last problem leads to a narrow phase locked loop bandwidth, with accompanying slow acquisition and excessive phase noise, or it leads to a more complex modulation input network to compensate for the effects of the loop.

SUMMARY OF THE INVENTION

The present invention pertains to a nearly DC IF, Phase Locked Transceiver and more particularly to a communications transceiver including receiving means for receiving radio frequency (RF) signals having information modulated thereon, mixing means coupled to said receiving means for converting the received RF signals to intermediate frequency (IF) signals including the information modulated on the RF frequency, low pass filter means coupled to said mixing means for filtering output signals therefrom and passing only the information modulated on the RF frequency, and a phase locked loop coupled to said low pass filter means for demodulating the information modulated on the RF frequency and supplying the information at an output. Because the IF is not DC, but a very low frequency, it can be AC coupled in the circuitry. In addition, the IF filter is not included in the phase locked loop and thus does not constrain the loop bandwidth.

It is the object of the present invention to provide a new and improved communications transceiver.

It is a further object of the present invention to provide a new and improved communications transceiver utilizing a nearly DC IF and a phase locked loop demodulator which does not contain the IF filter.

It is a further object of the present invention to provide a new and improved transceiver utilizing a digital signal processor substantially completely integrated on a semiconductor chip.

It is a further object of the present invention to provide an improved transceiver in which the phase locked loop bandwidth can be made wide enough to allow FM demodulation in the receive mode and FM modulation of the transmit carrier in the transmit mode.

It is a further object of the present invention to provide an improved transceiver which can be utilized with AM, FM, or PSK types of modulation.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the FIGS.

DESCRIPTION OF THE PREFERRED EMBODIMENT

Figure 1:
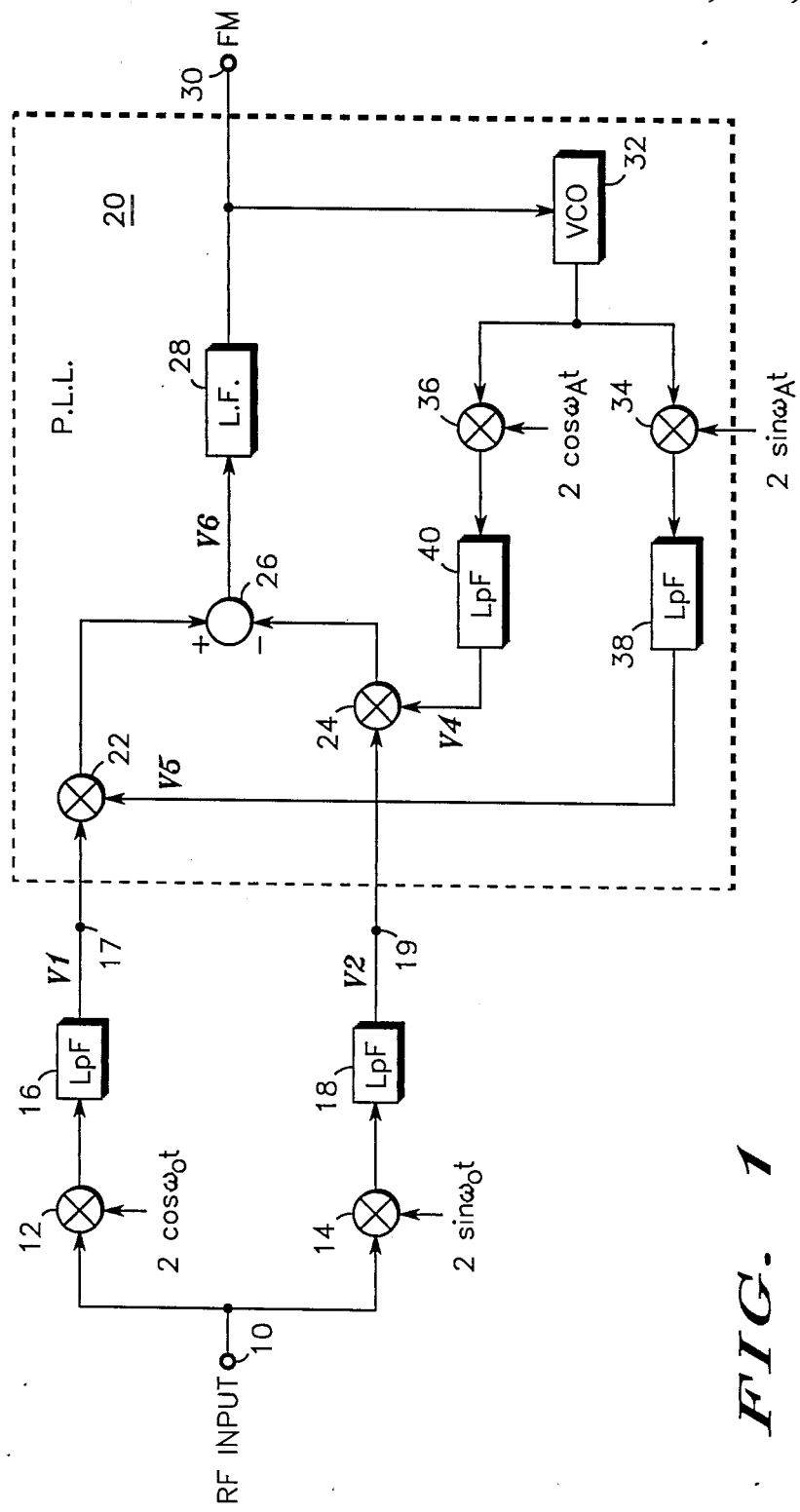
FIG. 1 is a simplified block diagram of a receiver incorporating portions of the present invention.

Referring specifically to FIG. 1, a simplified block diagram of a receiver incorporating portions of the present invention is illustrated. Various technical components, such as amplifiers and the like, are not illustrated to simplify the drawing for better understanding of the concepts disclosed herein. An RF input 10 is constructed to be connected to receive radio frequency (RF) signals having information modulated thereon. Terminal 10 may be connected, for example, to an antenna or other source of RF signals. Terminal 10 is further connected to a first input of a first local oscillator mixer 12 and a first input of a second local oscillator mixer 14. Each of the local oscillator mixers 12 and 14 has a second input connected to receive signals in quadrature from a local oscillator. Mixer 12 supplies IF signals modulated with the information received at terminal 10 through a low pass filter 16 to an output terminal 17 of channel one. Mixer 14 supplies IF signals modulated with the information received at terminal 10 through a second low pass filter 18 to an output terminal 19 of channel two. Output terminals 17 and 19 form first and second input terminals for a phase locked loop generally designated 20. Phase locked loop 20 includes a first IF mixer 22 having a first input connected to terminal 17 and a second IF mixer 24 having a first input connected to terminal 19. A combining circuit 26 subtracts output signals provided by mixer 24 from output signals provided by mixer 22 and couples the resulting signals through a loop filter 28 to an output terminal 30. The output signals from loop filter 28 are also supplied to a control input of a voltage controlled oscillator (VCO) 32. Output signals from VCO 32 are supplied to first inputs of first and second reference frequency mixers 34 and 36. Mixers 34 and 36 each having second inputs connected to receive reference frequency signals thereon in quadrature. It will of course be understood that the output of VCO 32 can be supplied to the first inputs of mixers 34 and 36 in quadrature and the reference frequency signals can be supplied in-phase, if desired. Since such modifications are generally well known to those skilled in the art and are clear equivalents of the structure shown, such modifications will not be elaborated upon herein. The output signals from mixer 34 are supplied through a third low pass filter 38 to a second input of mixer 22. The output signals from mixer 36 are supplied through a fourth low pass filter to a second input of mixer 24. In the particular receiver illustrated, phase locked loop 20 does not contain IF filters 16 and 18 and, further, filters 16 and 18 are AC coupled to mixers 22 and 24, respectively. Thus, phase locked loop 20 is constructed wide enough to demodulate FM, which is the output at terminal 30.

Assuming that the RF input signal at terminal 10 is:

$$RF\ input = \sin[wot + m(t)]$$

where:

$wo$ = center frequency of the local oscillator, $m(t)$ = information.

Further, the signal from the local oscillator on the second input of mixer 12 is $2\cos wot$ and the signal on the second input of mixer 14 is $2\sin wat$. Using the following identities and assuming that low pass filters 16 and 18 reject terms such as $\sin(a+b)$, the following is true:

$$2\sin a \sin b = \cos(a - b) - \cos(a + b)\ \text{and}$$

$$2\sin a \cos b = \sin(a - b) + \sin(a + b),\ \text{then:}$$

-continued $$V1 = \sin[wot + m(t) - wot] = \sin m(t)$$

$$V2 = \cos[wot + m(t) - wot] = \cos m(t)$$

Thus, signals V1 and V2 are the output signals at terminals 17 and 19, respectively.

Figure 2:
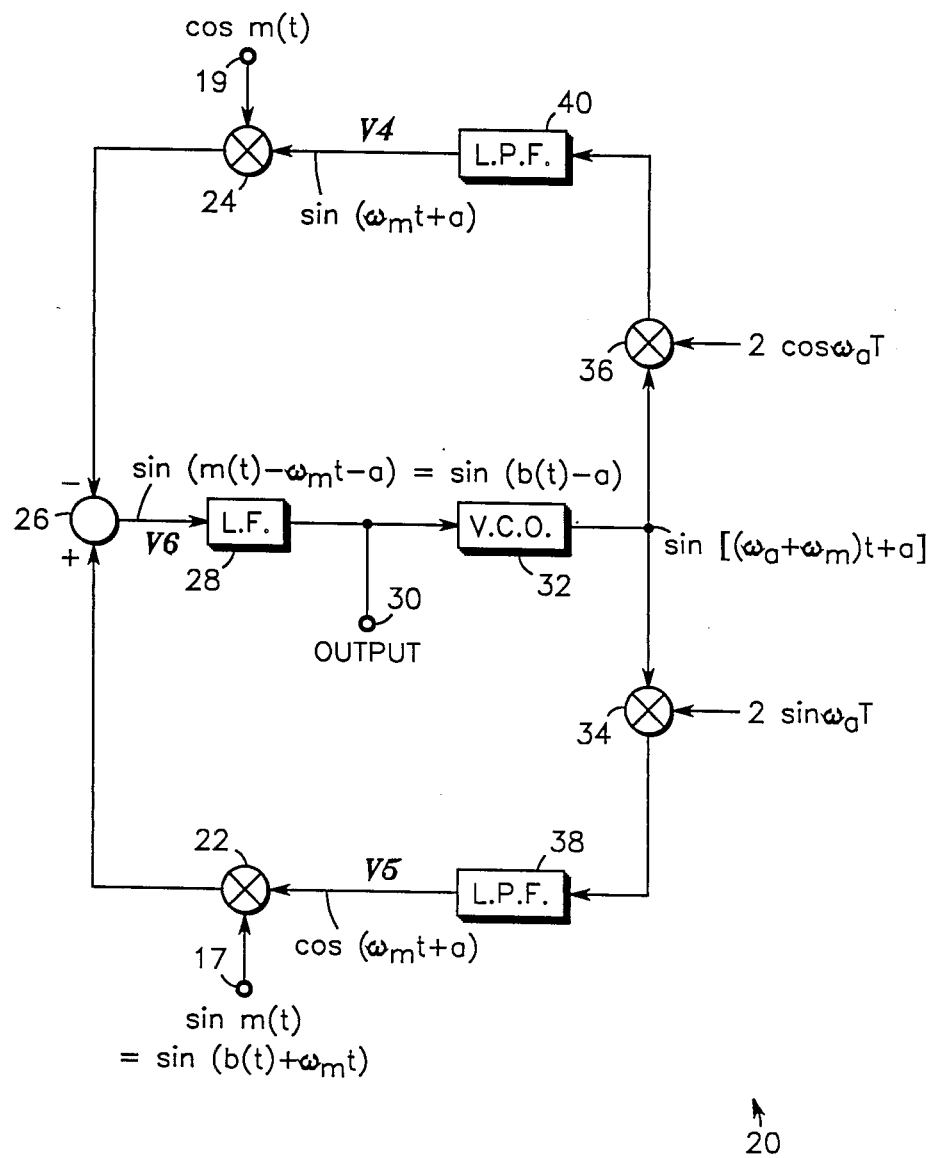
FIG. 2 is a redrawn simplified block diagram of a portion of FIG. 1 illustrating various specific signals at different points of the circuit.

Referring to FIG. 2, phase locked loop 20 is illustrated slightly redrawn with various signals labeled to aid in understanding the circuit.

$$VCO\ output = \sin[(wa + wm)t + a]$$

where:

$wa$ = center frequency of a reference oscillator, $wm$ = arbitrary frequency offset, and $a$ = arbitrary phase offset.

The reference frequency signals supplied to the second inputs of mixers 34 and 36 are in quadrature and are $2\cos wat$ and $2\sin wat$, respectively. Again, assuming that low pass filters 38 and 40 reject terms such as $\sin(a+b)$, the following is true:

$$V4 = \sin(wat + wmt + a - wat) = \sin(wmt + a)$$

$$V5 = \cos(wat + wmt + a - wat) = \cos(wmt + a)$$

Where V4 and V5 are the outputs of low pass filters 40 and 38, respectively. Using the identities:

$$\sin(a-b) = \sin a \cos b - \cos a \sin b$$

and $$\cos(a-b) = \cos a \cos b + \sin a \sin b,$$

then:

$$V6 = \sin[m(t) - wmt - a]$$

let $m(t) = b(t) + wmt$, where $b(t)$ = arbitrary phase information (including a fixed phase offset) then:

$$V6 = \sin[b(t) - a]$$

V6 is the output of combining circuit 26, which is connected through loop filter 28 to the control input of VCO 32. Any voltage at the output of combining circuit 26 causes the output of VCO 32 to change phase in such a direction that the output of combining circuit 26 goes towards zero. This, of course, is a phase locked loop, where all the mixers used to form the output of combining circuit 26 are the loop phase detector. Since there is no limitation on the bandwidth of phase locked loop 20, the bandwidth can be made wide enough to follow an FM modulated signal.

The offset frequency, $wm$, is arbitrary. Therefore the offset frequency can be anywhere in the range of 1 Hz to approximately 1000 Hz. It will be understood by those skilled in the art that too much offset will distort the signal because of low pass filters 16 and 18. Because the outputs of low pass filters 16 and 18 are the offset frequency modulated with information (rather than DC with audio frequency information) outputs 17 and 19 of the first and second IF channels can be AC coupled to mixers 22 and 24, respectively, with no effect upon phase locking the carrier. If the IF is AC coupled to a low enough frequency (i.e. 1 Hz), and the carrier is FM modulated at a rate much higher than this (greater than 10 Hz), the only effect would be a small glitch in the output as the carrier goes through the local oscillator center frequency.

Figure 3:
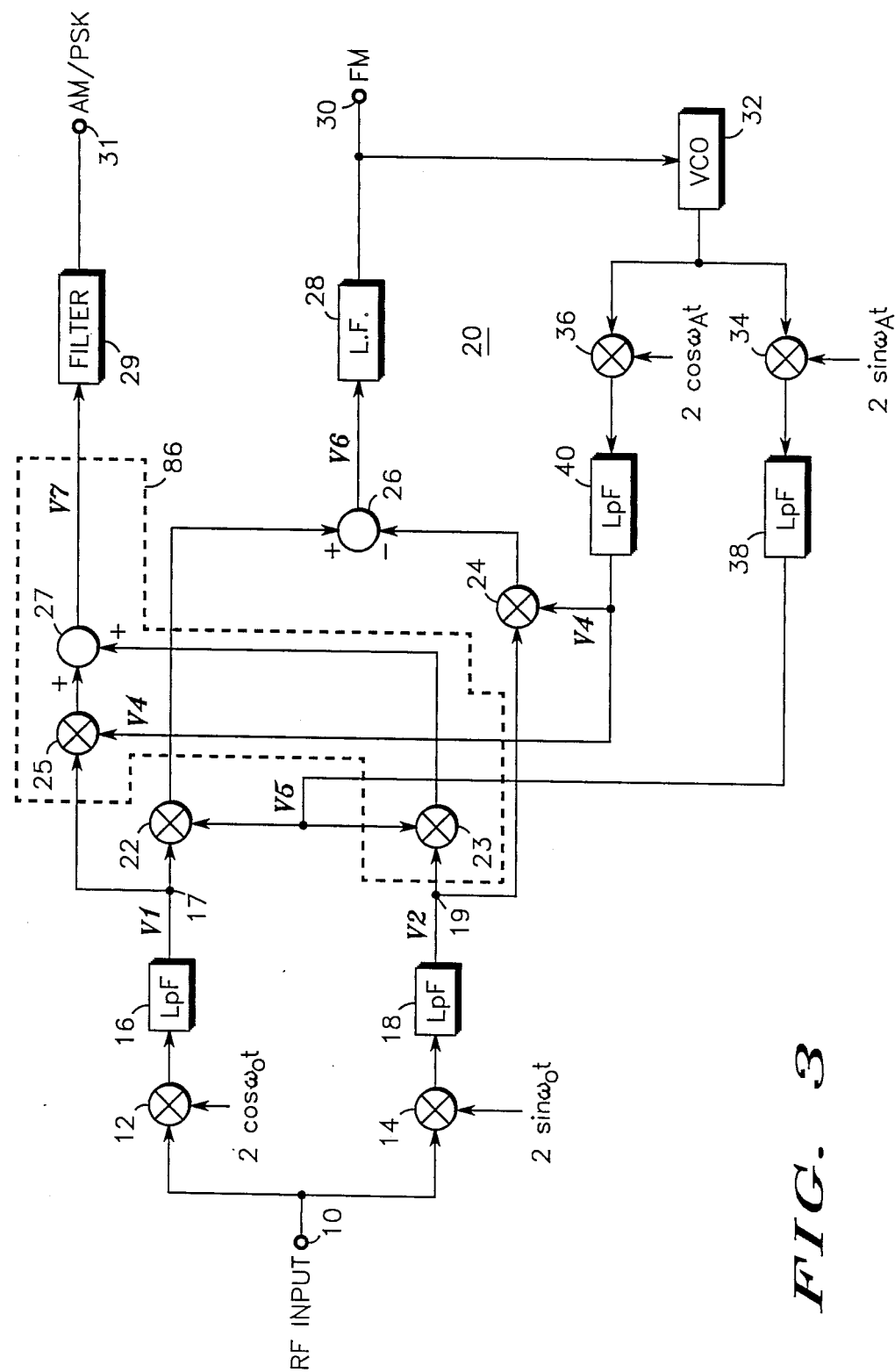
FIG. 3 is a simplified block diagram of a modified version of the receiver illustrated in FIG. 1, including circuitry for demodulating AM or PSK signals.

Referring specifically to FIG. 3, a simplified block diagram of a receiver which may be utilized for demodulating AM or PSK signals, as well as FM, is illustrated. Because the block diagram of FIG. 3 is essentially the same as FIG. 1 with some additions, similar parts are designated with similar numbers to more easily understand the operation. Since the structure which is similar to FIG. 1 has already been described and operates in the same fashion, only the additional components will be described at this point. The second IF channel output at terminal 19 is coupled to a first input of a third IF mixer 23. The first IF channel output at terminal 17 is coupled to a first input of a fourth IF mixer 25. The output of low pass filter 38 is coupled to a second input of mixer 23 and the output of low pass filter 40 is coupled to a second input of mixer 25. The outputs of mixers 23 and 25 are added together in a combining circuit 27, the output of which is coupled through a filter 29 to an output terminal 31. Using the trigonometric identities above, the output of combining circuit 27 is:

$$V7 = \cos[m(t) - wmt - a]$$

Further, using the definition of m(t) previously listed this output becomes:

$$V7 = \cos[b(t) - a]$$

It will be recognized that V7 represents a coherent amplitude detector output with mixers 23 and 25 and combining circuit 27 constituting a coherent amplitude detector 86. If the RF signal input at terminal 10 has a magnitude change when loop 20 is locked, V7 will follow that change. Further, if the RF carrier is amplitude modulated and the offset frequency, wm, is equal to or greater than 1 Hz, the only noticeable effect will be when a modulation side band goes through the local oscillator center frequency, wo. This will appear to be a notch in the audio response at the offset frequency. However, the notch will only be 2 Hz wide. If the RF carrier at terminal 10 is biphase modulated, and the data rate is higher than the offset frequency, there will be no degradation to the demodulated output. The carrier offset in all of the above cases must be equal to or greater than 1 Hz.

A major difference between the present nearly DC IF, phase locked transceiver and DC IF transceivers is in the automatic gain control (AGC) circuits. The DC IF receiver, when it is phase locked, will have the I channel at maximum and the Q channel at zero. There is no way to AGC the channels separately. This means that amplitude detector inputs to the DC IF receiver must handle much higher dynamic range than the present AC coupled IF receiver. This substantially higher dynamic range may not be practical, so to reduce the dynamic range required in the DC IF receiver, the 2 channels can be AGC'd from the same control point, however they must have identical characteristics over their full AGC range. If the 2 channels do not track in gain and phase, an error term, the second harmonic of the offset frequency, appears on the two detector outputs.

Figure 4:
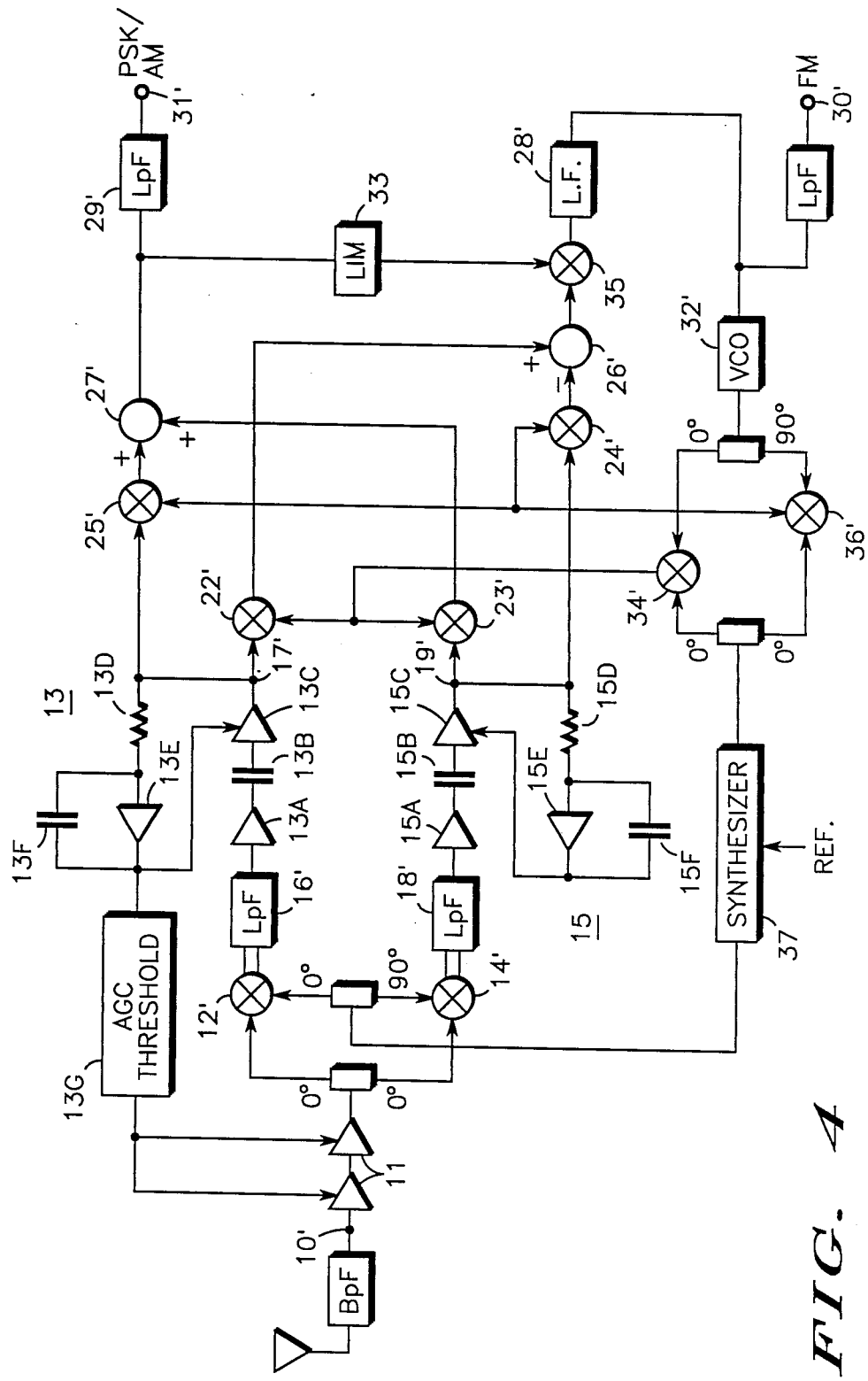
FIG. 4 is a block diagram of a complete receiver incorporating portions of the present invention.

In the present AC coupled receiver, an amplitude detector, such as a diode, can be used on either the I or Q channels to obtain AGC information. In fact, if each channel uses separate AGC loops, the I and Q channels can be made to gain track each other very accurately. FIG. 4 shows a block diagram of a complete receiver embodying portions of the present invention, with individual AGC controls on each channel. Components similar to those illustrated in FIG. 3 are marked with a similar number having a prime added to indicate a second embodiment. Components similar to those illustrated in FIG. 3 will not be described in further detail.

Referring specifically to FIG. 4, an antenna supplies received RF signals through a band pass filter to RF input terminal 10'. The RF signals at terminal 10' are coupled through controllable amplifiers 11 to the inputs of the first and second IF channels. A synthesizer 37, operating as the local and reference frequency source, supplies local oscillator signals in quadrature to the second inputs of mixers 12' and 14'. Synthesizer 37 also supplies reference frequency signals to the second inputs of reference frequency mixers 34' and 36'. An AGC circuit, generally designated 13, is coupled between low pass filter 16' and first IF channel output 17'. An AGC circuit generally designated 15 is coupled between the output of low pass filter 18' and second IF channel output 19'. Included with AGC circuit 13 is an IF amplifier 13A having an input coupled to the output of low pass filter 16' and an output coupled through an AC coupling capacitor 13B to an input of a controllable amplifier 13C. The output of amplifier 13C is coupled to output terminal 17' of the first IF channel and through a resistor 13D to the input of an operational amplifier 13E. The output of operational amplifier 13E is coupled to the control input of controllable amplifier 13C and through a capacitor 13F to the input of operational amplifier 13E. In a similar fashion components 15A through 15F of AGC circuit 15 are connected between the output of low pass filter 18' and output 19' of the second IF channel. Also, the output of operational amplifier 13E is coupled through an AGC threshold circuit 13G to control inputs of controllable amplifiers 11. This additional RF AGC has been added to allow stronger signal operation. Further, the output V7 of combining circuit 27' is coupled through a limiter 33 to one input of a mixer 35. The mixer 35 is coupled into phase locked loop 20 by connecting the output of combining circuit 26' to a second input thereof and the output to loop filter 28'. This modification of the previous receiver provides for demodulation of a biphase or quadraphase signal by forming a Costas demodulator with V6 (the output of combining circuit 26') as the Q channel detector output and V7 (the output of combining device 27') as the I channel detector output.

Figure 5:
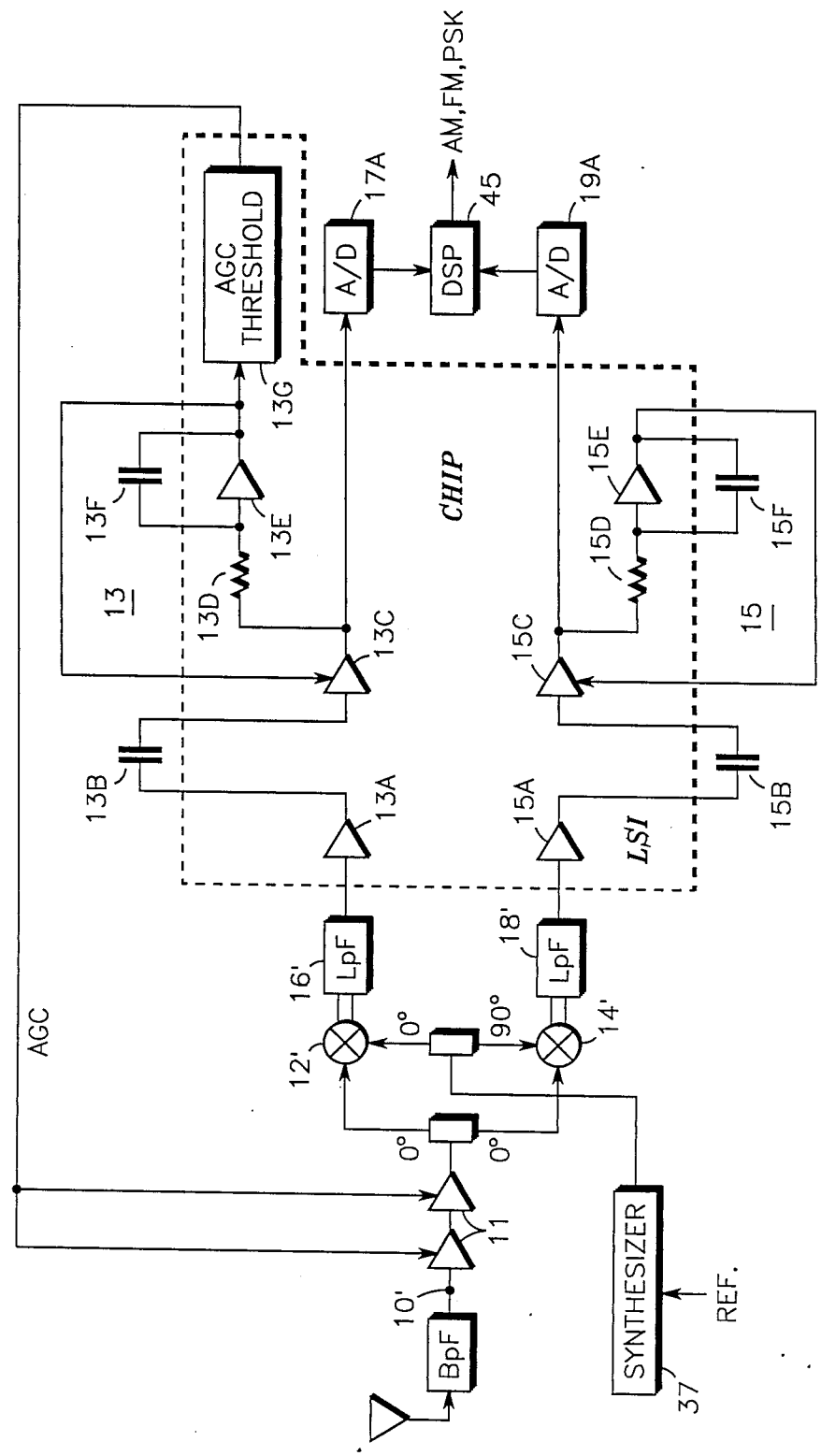
FIG. 5 is a block diagram of a complete receiver in which major portions are incorporated into integrated circuits.

Referring specifically the FIG. 5, the receiver of FIG. 4 is illustrated with the AGC circuits integrated on a semiconductor chip, designated by the dotted lines. Further, the output of the first and second IF channels are converted from analog to digital signals by A-to-D converters 17A and 19A, respectively. The digital signals from A-to-D converters 17A and 19A are supplied to a digital signal processor 45 which performs the functions of the phase locked loop, the coherent amplitude detector, and/or biphase or quadraphase Costas demodulator. It will of course be understood that synthesizer 37 may also be included in the digital circuitry and in many instances the various filters may be active and integrated. Thus, it is believed that substantially the entire receiver can be integrated into one or more semiconductor chips.

Figure 6:
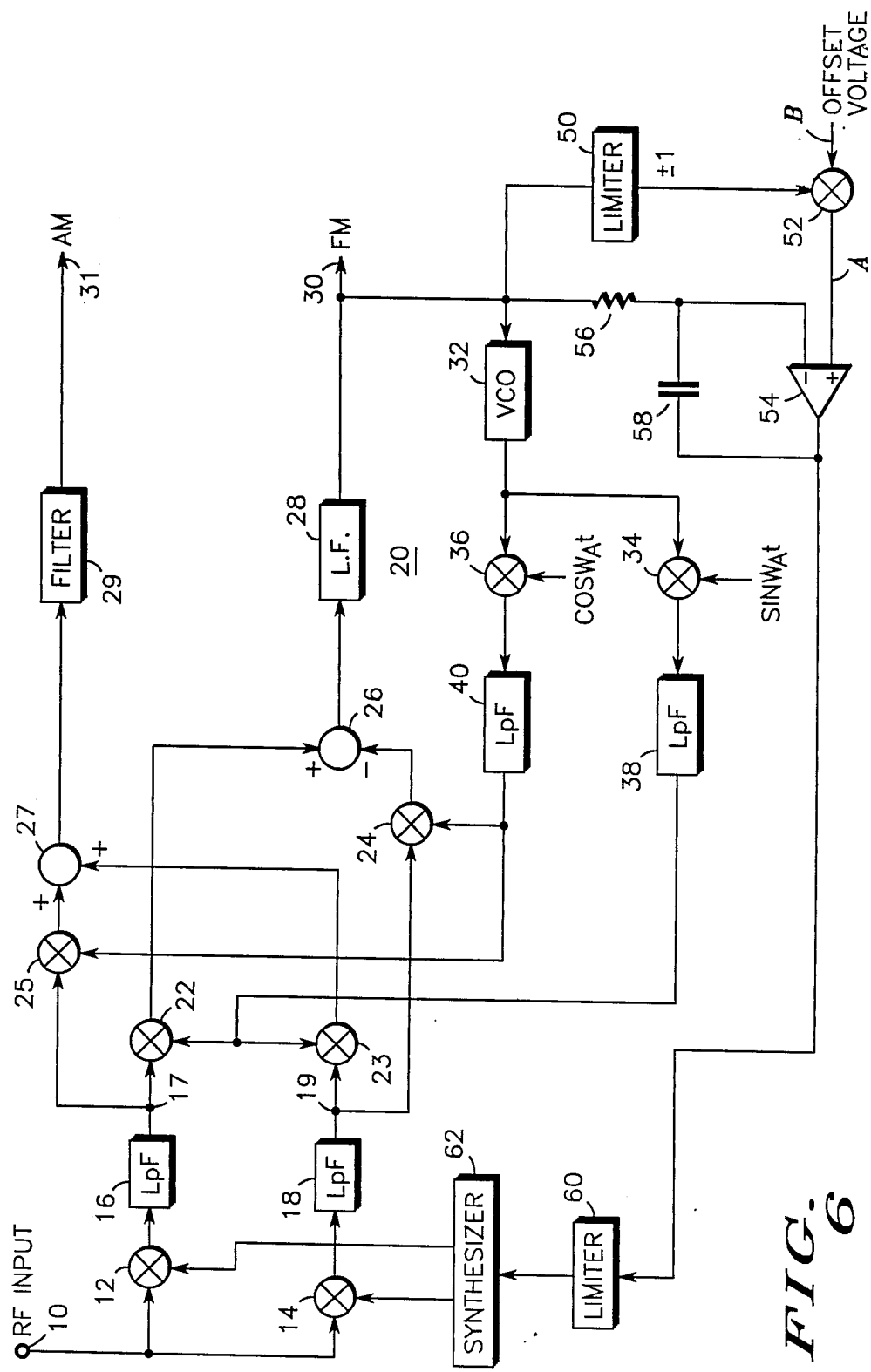
FIG. 6 is a simplified block diagram of a receiver incorporating further portions of the present invention.

In some cases, such as receiving BPSK at 75 bits per second or subaudible AM tones, it may desirable to control the offset frequency wm. If it is necessary to control the offset frequency, a slow frequency locked loop around the synthesizer can be used. Referring specifically to FIG. 6, a block diagram of this concept is illustrated. In this diagram the same receiver as was illustrated in FIG. 3 is utilized and all similar components are marked with the same number. These components will not be discussed further, except as is required to explain the slow frequency locked loop. The demodulated output from loop filter 28 is coupled through a limiter 50 to one input of a combining circuit 52. A second input of combining circuit 52 is adapted to receive an offset voltage and the output thereof is connected to the positive input of an operational amplifier 54, the negative input of which is connected through a resistor 56 to the output of loop filter 28. A capacitor 58 couples the output of amplifier 54 to the negative input thereof and the output is also coupled through a limiter 60 to the control input of a synthesizer 62. Synthesizer 62 supplies the local oscillator signals to IF mixers 12 and 14. The slow frequency locked loop seeks to hold the error voltage at the positive input of operational amplifier 54 at 0 volts. A positive voltage into synthesizer 62 causes the local oscillator frequency to increase. Depending upon whether the RF frequency at terminal 10 is higher or lower than the local oscillator frequency, an increasing voltage to synthesizer 62 will cause the IF offset frequency to increase or decrease. The control voltage supplied to VCO 32 is always a correct indicator of whether the RF signal at terminal 10 is above or below the local oscillator frequency. By changing the sense of the offset voltage supplied to multiplier 52, the offset frequency is always driven away from DC. The offset frequency stability is a direct function of the control voltage supplied to VCO 32. This requires that VCO 32 be quite accurate. In the digital version of this receiver (FIG. 5), the VCO signal is synthesized from a reference clock and can be very stable. The slow frequency locked loop can react very slowly. The only requirement is that it gradually push the offset frequency away from the 1 Hz AC coupling corner.

Figure 7:
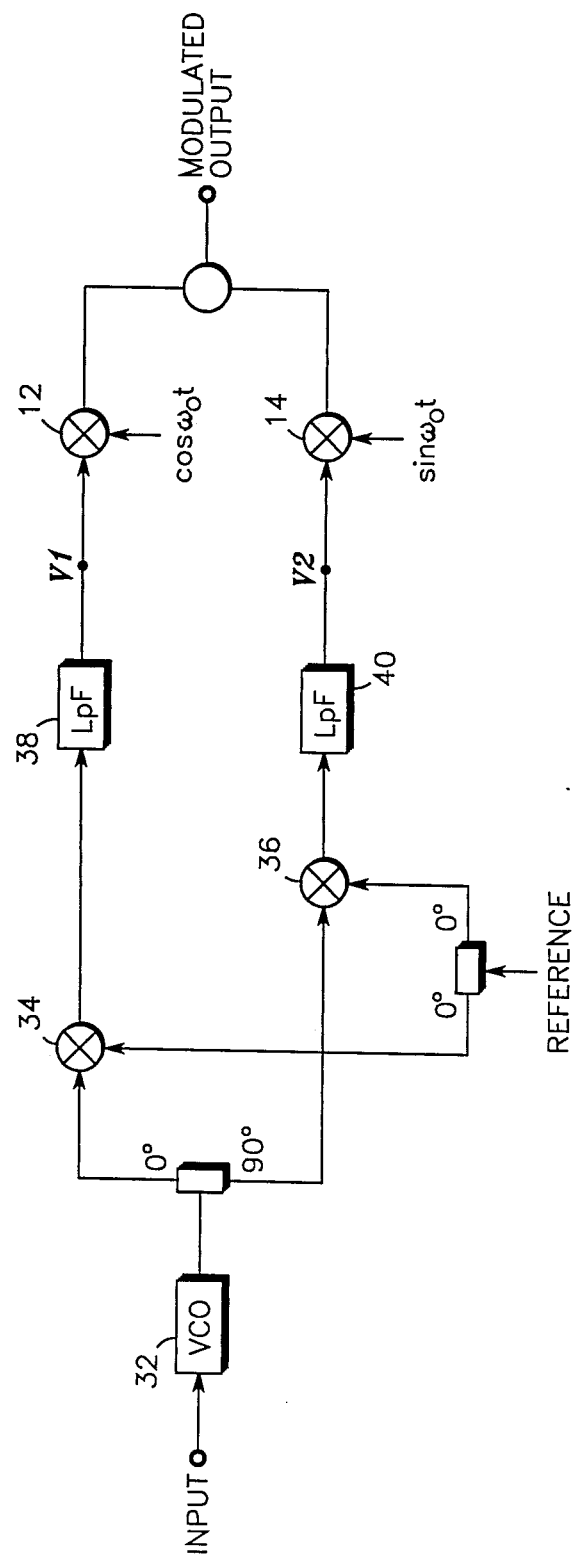
FIG. 7 illustrates a simplified block diagram of an FM transmitter incorporating portions of the present invention.

The novel receiver configuration described herein leads to an FM transmitter which solves the problems specified above in conjunction with the DC IF receiver. Further, the configuration allows a wide variety of modulation schemes to be done quite easily, including, but not limited to, BPSK, QPSK and shaped BPSK (SBPSK). Referring specifically to FIG. 7, a simplified block diagram of an FM transmitter employing elements from the receiver of FIG. 3 is illustrated. The VCO 32 is utilized, with the control input connected to receive the modulating information. The output of VCO 32 is coupled through a quadrature signal divider to first and second mixers which may be, for example, mixers 34 and 36 of FIG. 3. Because mixers 34 and 36 are already connected to the output of VCO 32 in the receiver circuit and the second inputs thereof are connected to the reference frequency, this use would require the least amount of switching to convert the receiver to a transmitter. At this point, the only switching required is at the input of VCO 32. The outputs of mixers 34 and 36 are than coupled through low pass filters which may be, for example, low pass filters 38 and 40 already coupled to the outputs of mixers 34 and 36. The output of low pass filters 38 and 40 are than coupled to inputs of local oscillator mixers, for example, mixers 12 and 14. If mixers 12 and 14 are utilized at this point it will be seen that the second inputs thereof are already connected to the local oscillator. The outputs of mixers 12 and 14 are than combined and supplied to an antenna through circuitry, such as RF amplifiers and the like. It will of course be understood by those skilled in the art that while the transmitter of FIG. 7 is illustrated with components from the receiver from FIG. 3 switched into different modes of operation, that different components might be utilized if that is more convenient or more desirable.

In the operation of the transmitter of FIG. 7, assume that a positive input voltage to VCO 32 causes the output frequency thereof to be higher than the reference frequency supplied to mixers 34 and 36 by an amount wm. After low pass filters 38 and 40, only the low frequency terms remain:

$$V1 = \sin wmt \text{ and } V2 = \cos wmt$$

Then the output is:

$$\sin(wot + wmt) = \cos wmt \sin wot + \sin wmt \cos wot$$

The output frequency has been increased by an amount wm. Likewise with a negative voltage supplied to the input of VCO 32, the output frequency will be decreased. A time varying input causes the output frequency to be time varying. In general, complex modulation can be accomplished by the two signals V1 and V2. All bandpass signals can be written in the form of XC coswt−XS sinwt. XS and XC are low pass functions which contain frequencies lower than w, the center frequency. If XC and XS are each independent time series whose values are +1 or −1, the output is QPSK modulated. If XC and XS are equal to each other and also are a +1, −1 series, the output is BPSK modulated. Any repetitive wave form could easily be generated from a table of values which are stored in a read only memory.

Figure 8:
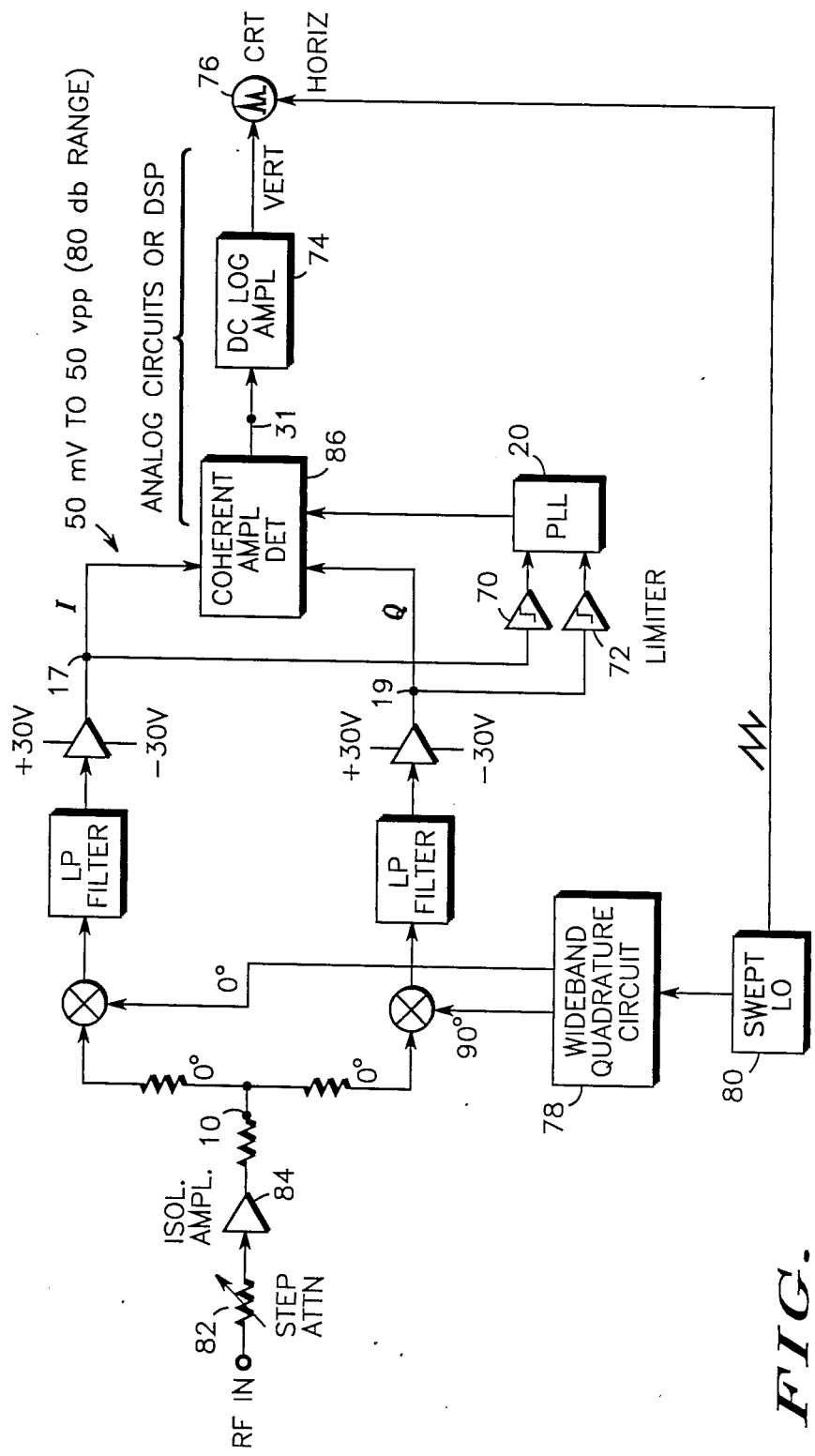
FIG. 8 is a simplified block diagram of an image-free spectrum analyzer, which may be a portion of a transceiver or may be constructed separately.

It should be noted that the coherent amplitude detector of FIG. 3 (output V7 at terminal 31) can also be used for providing a signal amplitude useful for an imageless spectrum analyzer. Referring specifically to FIG. 8, such an image-free spectrum analyzer is illustrated. In this specific embodiment the structure of FIG. 3 is illustrated in a somewhat simplified form and limiters 70 and 72 are added between the output of the inphase channel and the input to phase locked loop 20 and between the output of the quadrature channel and the input of the phase locked loop 20, respectively. Further, the output of the coherent amplitude detector (terminal 31 in FIG. 3) is supplied through a DC log amplifier 74 to the vertical input of a visual display 76. Also, a wideband oscillator or synthesizer 78 is utilized as the local oscillator to supply local oscillator signals to the IF mixers, which wideband oscillator 78 has a control input. A sweep circuit 80 is connected to the control input of oscillator 78 and to the horizontal input of visual display 76. Thus, sweep circuit 80 sweeps wideband oscillator 78 across its spectrum at the same time that it sweeps visual display 76 across the display. The RF input to be analyzed is coupled to input 10 and, in this example, is coupled through a step attenuator 82 and an isolation amplifier 84. It will of course be understood by those skilled in the art that the spectrum analyzer of FIG. 8 could be incorporated as a portion of a transceiver if that were desirable or could be constructed as a separate piece of equipment.

Thus, a transceiver has been disclosed which converts the received RF carrier to a very low frequency and allows the IF to be AC coupled. In addition, the receiver phase locked loop does not contain the IF filters. Further, the phase locked loop is wide enough to demodulate FM and the DC offsets in the mixers and IF amplifiers are no longer important. Thus, the disadvantages of the DC IF receiver have been eliminated while all of the advantages are still preserved. Also, the transceiver incorporates an AGC system which causes the I and Q amplifier gain values to match. With some minor switching of components the demodulator can be used as an FM or PSK modulator for signal transmission. Also, for applications where it is required, the IF offset frequency can be controlled through the use of a slow frequency locked loop. Finally, the high dynamic range IF and coherent amplitude detector allows the use of an image-free spectrum analyzer log display of signal amplitude at the input thereof using a log amplifier at base band rather than at IF.

By AC coupling the high gain IF amplifier and the near DC IF Demodulator, a small amount of distortion occurs within signals with frequencies near DC, such as when the carrier, or a modulation side band, goes through the local oscillator center frequency. The distortion occurs when a relatively large percentage of the IF energy is contained in a single spectral line whose frequency falls between DC and the cutoff frequency of AC coupling capacitors 13B and 15B of FIG. 4 (DC to ±0.5 Hz). For instance, assume an input RF frequency exactly equal to the local oscillator frequency (synthesizer 37 of FIG. 4). The resulting IF signal would be DC and would be completely blocked by the AC coupling capacitors 13B and 15B. PLL 20 would have no input and would not lock.

To reduce the effect of the AC coupling, the signal from synthesizer 37 is spread using random noise. The resulting spectrum is spread sufficiently that only a small percent of the IF energy is lost in the AC coupling of terminals 17 and 19. The AC coupling is, in effect, a very narrow notch filter. The IF is de-spread in mixers 22' and 23' and demodulated after it has passed through AC coupling capacitors 13B and 15B. In principle, the random noise modulates the VCO with a peak frequency deviation set to 300 Hz so that the modulation index is large (greater than 2 radian) and the noise is band limited resulting in a spectrally contained randomly modulated local oscillator. With the modulation index large, the energy lost by the AC coupling is substantially reduced.

Figure 9:
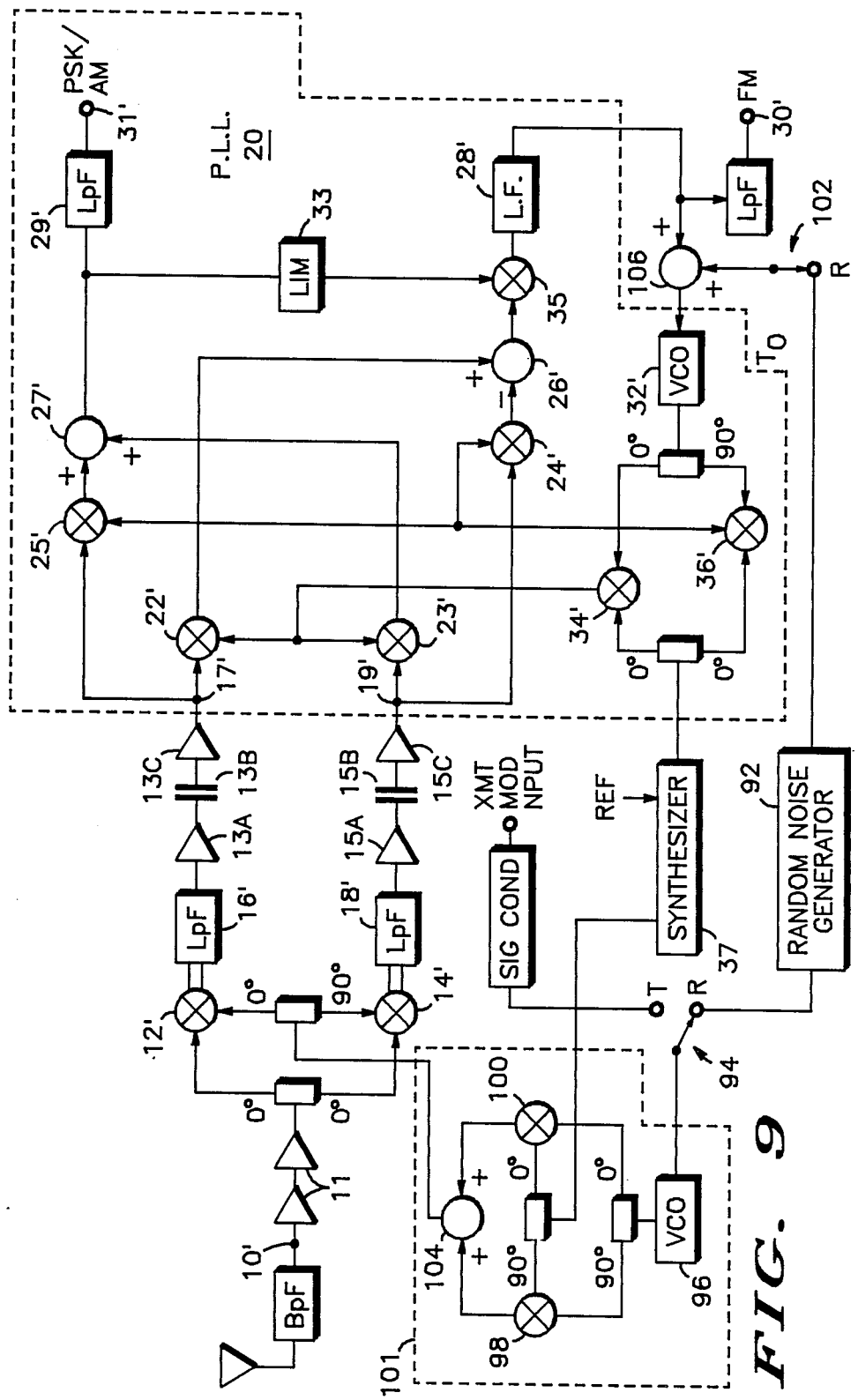
FIG. 9 is a simplified block diagram of a modified version of FIG. 3 showing a spreader/de-spreader circuit coupled to the receiver.

FIG. 9 shows the simplified block diagram of the receiver of FIG. 4 coupled to a signal spreader to overcome the effects of AC coupling and achieve the operation discussed above. Random noise is generated within pseudo-random noise generator 92 and is band limited from 10 to 100 Hz. Noise generator 92 is coupled through a first output to VCO 96 through switch 94. Switch 94 allows noise generator 92 to be disconnected from VCO 96 when the device is operating as a transmitter. VCO 96 is modulated by random noise from generator 92 to provide modulated signals in quadrature. These noise modulated signals are multiplied with two quadrature signals from synthesizer 37 in mixers 98 and 100. The resulting two signals are added in combiner 104 to provide a single L.O. signal which has been FM modulated with band limited noise. After mixing this L.O. signal, with the received signal in mixers 12' and 14', the I and Q signals in their spread condition are able to pass through AC coupling capacitors 13B and 15B with minimal signal loss. For example, assume a DC IF signal is converted to a band of frequencies in the range of −300 Hz to +300 Hz, and the AC coupling circuit is a high pass filter of 0.5 Hz (double sided 1 Hz notch filter). Approximately 1/600 of the 600 Hz wide IF signal would be rejected by the filter. Therefore, 99.8% of the signal would be available to PLL 20. The remaining 0.2% portion of the IF signal is converted to noise that is not correlated to the despreading waveform and thus produces distortion in the demodulated signal. Since the spreading is band-limited, and below 100 Hz, a majority of this distortion contains frequency components below 100 Hz. This small amount of distortion is subaudible in most receivers.

In the receiver mode, random noise is supplied to VCO 32 which has characteristics identical to VCO 96. Specifically, generator 92 is coupled to combiner 106 through switch 102. Combiner 106 combines the signal received from loop filter 28 with noise from generator 92 and outputs the combined signal to VCO 32. By receiving the same random noise, with the appropriate phase, from generator 92 that is used to spread the L.O. signal in modulator 101, VCO 32 demodulates the I and Q signals after the I and Q signals pass through AC capacitors 13B and 15B into PLL 20. The frequency deviations of the incoming I and Q signals are matched allowing de-spreading.

In the transmitter mode, pseudo-random noise generator 92 is disconnected from VCO 32 and VCO 96. Modulator 101 is then coupled to signal conditioner 108. Modulator 101 is used to generate any type of angle modulation such as FM, PM, PSK, or shaped BPSK suitable for up-conversion in the transmitter mode.

Thus, an improved transceiver has been disclosed which includes the advantages of fewer spurious responses with a simple preselector, greatly simplified IF filters and amplifiers which do not require shielding or critical layout, a simplified synthesizer with low noise and fast acquisition time, multiple types of modulation and demodulation with the modulation sensitivity being independent of RF frequency, and a digital signal processor can accomplish the demodulation as well as supplying complex modulation wave forms. Further, the new and improved transceiver can be easily integrated into one or more semiconductor chips.

While we have shown and described specific embodiments of this invention, further modifications and improvements will occur to those skilled in the art. We desire it to be understood, therefore, that this invention is not limited to the particular forms shown and we intend in the appended claims to cover all modifications which do not depart from the spirit and scope of this invention.

What I claim is:

1. A communications transceiver comprising:
   a local oscillator;
   a radio frequency (RF) input connected to receive RF signals modulated with information;
   a first channel including a first local oscillator (LO) mixer coupled to said RF input and said local oscillator for converting RF signals to intermediate frequency (IF) signals modulated with the information, and a first low pass filter coupled to the first LO mixer for receiving the information modulated IF signals and passing only the information modulated IF signals to a first channel output;

a second channel in quadrature with said first channel and including a second LO mixer coupled to said RDF input and said local oscillator for converting RF signals to IF signals modulated with the information, and a second low pass filter coupled to the second LO mixer for receiving the information modulated IF signals and passing only the information modulated IF signals to a second channel output;

a first voltage controlled oscillator (VCO) having a control input and an output;

first and second reference frequency mixers each having an input coupled to the output of said VCO, an input coupled to receive a reference frequency thereon, and an output;

third and fourth low pass filters coupled to the output of each of said first and second reference frequency mixers, respectively;

first IF mixer having a first input coupled to said third low pass filter, a second input coupled to the first channel output, and an output;

second IF mixer having a first input coupled to said fourth low pass filter, a second input coupled to the second channel output, and an output;

signal combining means having a first input coupled to the output of said first IF mixer, a second input coupled to the output of said second IF mixer, and an output;

third IF mixer having a first input coupled to the third low pass filter, a second input coupled to the second channel output, and an output;

fourth IF mixer having a first input coupled to the fourth low pass filter, a second input coupled to the first channel output, and an output;

second combining means having a first input coupled to the output of said third IF mixer, a second input coupled to the output of said fourth IF mixer, and an output;

filter coupled to the output of said second combining means for providing amplitude varying signals at an output thereof;

phase demodulator means for receiving and demodulating phase signals; and said phase demodulator means having a first input coupled to the output of said combining means, a second input coupled to the output of said second combining means, and an output coupled to said loop filter.

2. A communications transceiver as claimed in claim 1 wherein the first and second channel outputs are AC coupled to the second inputs of said first and second IF mixers, respectively.

3. A communications transceiver as claimed in claim 1 wherein the phase locked loop is constructed of digital circuits.

4. A communications transceiver as claimed in claim 3 wherein the phase locked loop is constructed on an integrated semiconductor chip.

5. A communications transceiver as claimed in claim 6 including in addition an IF amplifier coupled in each of said first and second channels between the low pass filters and the channel outputs and automatic gain control (AGC) circuits coupled to said IF amplifier in each channel.

6. A communications transceiver as claimed in claim 5 including in addition RF amplifier means coupled to said RF input for amplifying RF signals prior to coupling the signals to the first and second channels and at least one AGC circuit coupled to one of the AGC circuits in the first and second channels and to said RF amplifier means.

7. A communications transceiver as claimed in claim 6 wherein the first and second channels are integrated into a single semiconductor chip.

8. A communications transceiver as claimed in claim 1 including in addition a coherent amplitude detector coupled to said first and second channels and to said phase locked loop.

9. A communications transceiver as claimed in claim 1 wherein a frequency modulated carrier output is produced by switching the first and second reference frequency mixers from a receiving mode of operation to a transmission mode of operation; and switching the first and second LO mixers of the first and second channels from a receiving mode to a transmission mode of operation.

10. A communications transceiver as claimed in claim 1 wherein the local oscillator is constructed to produce an IF signal at an output of the first and second LO mixers in the range of approximately 1 Hz to 1000 Hz.

11. A communications transceiver as claimed in claim 1 wherein the local oscillator includes a controllable frequency synthesizer having a control input, and LO frequency control means coupled to the control input.

12. A communications transceiver as claimed in claim 11 wherein the LO frequency control means includes a combining circuit for inputting an offset voltage and circuitry coupling the control input of the controllable frequency synthesizer through said combining circuit to the information output of the phase locked loop.

13. A communications transceiver as claimed in claim 1 further including a DC log amplifier, a display monitor and frequency sweeping means, and the local oscillator is constructed so as to be frequency controllable through a control input, the amplitude varying signals being supplied to said display monitor through said log amplifier, and the frequency sweeping means being coupled to the control input of said local oscillator and to the display monitor for providing a substantially image free spectrum analyzer log display of the information at the RF input.

14. A communications transceiver according to claim 1 wherein said phase demodulator means comprises:

phase demodulator multiplier coupled into said phase locked loop between the combining means and the loop filter, said phase demodulator multiplier having a first input coupled to the output of said combining means, a second input, and an output coupled to the loop filter; and signal limiter having an input coupled to the output of said second combining means and an output coupled to the second input of said phase demodulator multiplier.

15. A communications transceiver according to claim 1 wherein said phase demodulator means receives and demodulates phase shift keyed (PSK) signals.

16. A communications transceiver according to claim 15 wherein said PSK signals are bi-phase.

17. A communications transceiver according to claim 15 wherein said PSK signals are quadra-phase.

18. A communications transceiver according to claim 1 wherein the transceiver further comprises:

spreader means for spreading the de-spreading said IF modulated signals in said first and second channels; and said spreader means having an input coupled to said first and second LO mixers, and an output coupled to said phase demodulator means.

19. A communications transceiver according to claim 18 wherein said spreader means comprises:
pseudo-random noise generator means for supplying pseudo-random noise to said first and second channels and said phase demodulator means;
VCO means for supplying a first and second spreader signal in quadrature;
first and second spread mixer means;
said first spread mixer means coupled to said VCO means to receive said first spreader signal, and to said local oscillator;
said second mixer means coupled to said VCO means to receive said second spreader signal, and coupled to said local oscillator;
said VCO means further coupled to said pseudo-random noise generator means to receive a portion of said pseudo-random noise; and
said pseudo-random noise generator means further coupled to said phase demodulator means.

20. A communications transceiver according to claim 19 wherein said pseudo-random noise generator means comprises a switching means for creating an open in the output of said pseudo-random noise generator when the communications transceiver operates as a transmitter.

21. A spectrum analyzer comprising:
a controllable local oscillator having a control input;
a radio frequency (RF) input connected to receive RF signals modulated with information;
a first channel including a first local oscillator (LO) mixer coupled to said RF input and said local oscillator for converting RF signals to intermediate frequency (IF) signals modulated with the information, and a first low pass filter coupled to the first LO mixer for receiving the information modulated IF signals and passing only the information modulated IF signals to a first channel output;
a second channel in quadrature with said first channel and including a second LO mixer coupled to said RF input and said local oscillator for converting RF signals to IF signals modulated with the information, and a second low pass filter coupled to the second LO mixer for receiving the information modulated IF signals and passing only the information modulated IF signals to a second channel output;
a voltage controlled oscillator (VCO) having a control input and an output;
first and second reference frequency mixers each having an input coupled to the output of said VCO, an input coupled to receive a reference frequency thereon, and an output;
third and fourth low pass filters coupled to the output of each of said first and second reference frequency mixers, respectively;
first IF mixer having a first input coupled to said third low pass filter, a second input coupled to the first channel output, and an output;
second IF mixer having a first input coupled to said fourth low pass filter, a second input coupled to the second channel output, and an output;
signal combining means having a first input coupled to the output of said first IF mixer, a second input coupled to the output of said second IF mixer, and an output;
a loop filter coupling the output of said signal combining means to the control input of said VCO;
a third IF mixer having a first input coupled to the third low pass filter, a second input coupled to the second channel output, and an output;
a fourth IF mixer having a first input coupled to the fourth low pass filter, a second input coupled to the first channel output, and an output;
second combining means having a first input coupled to the output of said third IF mixer, a second input coupled to the output of said fourth IF mixer, and an output;
an amplitude filter coupled to the output of said second combining means for providing amplitude varying signals at an output thereof;
a DC log amplifier having an input coupled to the output of said amplitude filter and an output;
a display having a data input coupled to the output of said DC log amplifier and a control input;
a sweep generating circuit having an output coupled to the control input of said display and to the control input of said controllable local oscillator.

22. A communications transceiver comprising:
local oscillator (LO) means for supplying a plurality of signals in quadrature;
radio frequency (RF) input means for receiving RF signals modulated with information;
noise generator means for supplying random noise;
modulator means coupled to said noise generator means to receive said random noise therefrom, and coupled to said local oscillator to receive said plurality of signals;
said modulator means for generating spread FM modulated signals from said plurality of signals from said local oscillator means, and from said random noise;
said first and second mixer means coupled to said modulator means to receive said spread FM modulated signals in quadrature, and coupled to said RF input means to receive said RF signals;
first and second mixer means for converting said RF signals and said spread FM modulated signals to spread intermediate frequency (IF) signals modulated with said information;
first and second AC block means coupled to said first and second mixer means respectively to receive said spread IF signals;
said first and second AC block means for removing DC noise in said spread IF signals;
phase lock loop (PLL) means for demodulating said spread IF signals to supply a transceiver output; and
said PLL means coupled to said first and second AC block means, and coupled to noise generator means.

23. A communications transceiver according to claim 22 wherein said modulator means comprises:
modulator voltage controlled oscillator (VCO) means coupled to said noise generator means to receive said random noise;
said modulator VCO means for generating modulated spread signals;
first and second modulator mixer means coupled to said modulator VCO means to receive said modulated spread signals, and coupled to said LO means for receiving said plurality of signals from said LO means;

said first and second modulator mixer means for providing spread carrier signals in quadrature;

modulator combining means for combining said spread carrier signals to supply said spread FM modulated signals; and said modulator combining means coupled to said first and second modulator mixer means, and further coupled to said first and second mixer means.

24. A communications transceiver according to claim 22 wherein said PLL comprises:

PLL voltage controlled oscillator (VCO) means for supplying a plurality of demodulating carrier signals in quadrature;

first and second reference mixer means coupled to said PLL VCO means to receive said demodulating carrier signals, and coupled to said local oscillator means to receive a plurality of reference signals in quadrature therefrom;

said first and second reference mixer means for combining said reference signals and said demodulating carrier signals to supply a plurality of demodulating signals in quadrature;

first and second IF mixer means coupled to said first and second reference mixer means respectively to receive said plurality of demodulating signals, and coupled to said first and second AC block means respectively to receive said spread IF signals;

said first and second IF mixer means for demodulating said spread IF signals by combining said spread IF signals with said demodulating signals;

first combining means for combining said demodulated signals from said first and second IF mixer means;

said first combining means coupled to said first and second IF mixer means;

second combining means coupled to said first combining meaus for receiving a portion of said combined demodulated signal, and coupled to said noise generator means to receive said random noise therefrom;

said second combining means for combining said demodulated signal and said random noise to generate a control signal; and said second combining means further coupled to said PLL VCO to supply said control signal to said PLL VCO.

25. A communications transceiver according to claim 24 wherein said PLL further comprises:

third IF mixer means coupled to said first AC block means to receive said spread IF signal therefrom, and to said second reference mixer means to receiving said quadrature demodulated signal;

said third IF mixer means for demodulating said spread IF signal received from said first AC block means;

fourth IF mixer means coupled to said second AC block means to receive said spread IF signal therefrom, and to said first reference mixer means to receive said demodulated signal;

said fourth IF mixer means for demodulating said spread IF signal received from said second AC block means;

third combining means for combining said demodulated signals from said third and fourth IF mixer means to produce an output;

said third combining means coupled to said third and fourth IF mixer means;

filter means coupled to said third combining means to receive said output therefrom; and said filter means for filtering said output to provide amplitude varying signals.

26. A communications transceiver according to claim 25 wherein said PLL futher comprises:

phase demodulator means for receiving and demodulating phase signals; and said phase demodulator means coupled to said third combining means to receive said output, and to said second combining means to provide a phase demodulator output.

\* \* \* \* \*